US010170327B2

(12) United States Patent
He et al.

(10) Patent No.: US 10,170,327 B2
(45) Date of Patent: Jan. 1, 2019

(54) FIN DENSITY CONTROL OF MULTIGATE DEVICES THROUGH SIDEWALL IMAGE TRANSFER PROCESSES

(71) Applicant: INTERNATIONAL BUSINESS MACHINES CORPORATION, Armonk, NY (US)

(72) Inventors: Hong He, Schenectady, NY (US); Chiahsun Tseng, Wynantskill, NY (US); Chun-Chen Yeh, Cliffton Park, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 15/613,774

(22) Filed: Jun. 5, 2017

(65) Prior Publication Data
US 2017/0271167 A1    Sep. 21, 2017

Related U.S. Application Data

(63) Continuation of application No. 14/697,306, filed on Apr. 27, 2015, now Pat. No. 9,728,419, which is a (Continued)

(51) Int. Cl.
*H01L 21/00* (2006.01)
*H01L 21/308* (2006.01)
(Continued)

(52) U.S. Cl.
CPC ...... *H01L 21/3086* (2013.01); *H01L 21/0338* (2013.01); *H01L 21/3065* (2013.01);
(Continued)

(58) Field of Classification Search
CPC ............ H01L 21/3086; H01L 21/3085; H01L 21/3065; H01L 21/3081; H01L 21/32136;
(Continued)

(56) References Cited

U.S. PATENT DOCUMENTS 5,432,106 A * 7/1995 Hong ................ H01L 29/66825
                                                    257/E21.422
6,610,576 B2   8/2003 Nowak
(Continued)

OTHER PUBLICATIONS

Choi, Y., et al, "A Spacer Patterning Technology for Nanoscale CMOS" IEEE Transactions on electron Devices, vol. 49, No, 3. Mar. 2002. pp. 436-441.

*Primary Examiner* — Ngan Ngo
(74) *Attorney, Agent, or Firm* — Tutunjian & Bitetto, P.C.; Vazken Alexanian

(57) ABSTRACT

Methods and structures for fabricating fins for multigate devices are disclosed. In accordance with one method, a plurality of sidewalls are formed in or on a plurality of mandrels over a semiconductor substrate such that each of the mandrels includes a first sidewall composed of a first material and a second sidewall composed of a second material that is different from the first material. The first sidewall of a first mandrel of the plurality of mandrels is selectively removed. In addition, a pattern composed of remaining sidewalls of the plurality of sidewalls is transferred onto an underlying layer to form a hard mask in the underlying layer. Further, the fins are formed by employing the hard mask and etching semiconducting material in the substrate.

19 Claims, 9 Drawing Sheets

Related U.S. Application Data continuation of application No. 14/139,121, filed on Dec. 23, 2013, now Pat. No. 9,064,901.

(51) Int. Cl.
*H01L 29/66* (2006.01)
*H01L 21/033* (2006.01)
*H01L 21/3065* (2006.01)
*H01L 21/3213* (2006.01)

(52) U.S. Cl.
CPC ...... *H01L 21/3081* (2013.01); *H01L 21/3085* (2013.01); *H01L 29/66545* (2013.01); *H01L 29/66795* (2013.01); *H01L 21/32136* (2013.01)

(58) Field of Classification Search
CPC ......... H01L 29/66795; H01L 29/66545; H01L 21/0338
See application file for complete search history.

(56) References Cited

U.S. PATENT DOCUMENTS

| | | | |
|---|---|---|---|
| 6,875,703 B1 | 4/2005 | Furukawa et al. | |
| 7,390,750 B1 * | 6/2008 | Ramkumar | H01L 21/0337 438/706 |
| 7,537,988 B2 | 5/2009 | Ekbote et al. | |
| 8,105,901 B2 | 1/2012 | Cheng et al. | |
| 8,138,030 B2 | 3/2012 | Chang et al. | |
| 8,343,877 B2 | 1/2013 | Cheng et al. | |
| 8,716,156 B1 * | 5/2014 | Pawlak | H01L 21/82382 438/770 |
| 8,729,702 B1 * | 5/2014 | Niu | H01L 21/2855 204/298.13 |
| 9,728,419 B2 * | 8/2017 | He | H01L 29/66795 |
| 2006/0138355 A1 * | 6/2006 | Yue | H01L 21/26513 250/492.21 |
| 2007/0004117 A1 * | 1/2007 | Yagishita | H01L 21/845 438/197 |
| 2007/0017799 A1 * | 1/2007 | Guo | C23C 14/352 204/192.1 |
| 2007/0077743 A1 * | 4/2007 | Rao | H01L 21/3086 438/595 |
| 2007/0145430 A1 * | 6/2007 | Sandhu | H01L 21/28114 257/288 |
| 2011/0101455 A1 | 5/2011 | Basker et al. | |
| 2012/0132616 A1 | 5/2012 | Barnola et al. | |
| 2012/0280283 A1 | 11/2012 | Cheng et al. | |
| 2014/0138800 A1 * | 5/2014 | He | H01L 29/02 257/632 |
| 2014/0291761 A1 * | 10/2014 | Cheng | H01L 29/785 257/347 |
| 2015/0084064 A1 * | 3/2015 | Yamamoto | H01L 29/42376 257/77 |
| 2017/0110364 A1 * | 4/2017 | Song | H01L 21/76816 |

* cited by examiner

FIN DENSITY CONTROL OF MULTIGATE DEVICES THROUGH SIDEWALL IMAGE TRANSFER PROCESSES

RELATED APPLICATION INFORMATION

This application is a Continuation application of co-pending U.S. patent application Ser. No. 14/697,306 filed on Apr. 27, 2015, incorporated herein by reference in its entirety.

BACKGROUND

Technical Field

The present invention relates to multigate devices, and, more particularly, to sidewall image transfer methods and structures employed in the fabrication of multigate devices.

Description of the Related Art

Fin density control and, in particular, fin density quadrupling can be implemented by performing a plurality of sidewall image transfer etching steps to form fins of multigate devices. However, these processes typically employ a relatively complicated patterning stack. For example, one such stack is composed of at least ten different layers and is relatively costly to fabricate and to utilize in fin formation processes.

SUMMARY

One embodiment is directed to a method for fabricating fins for multigate devices. In accordance with the method, a plurality of sidewalls are formed in or on a plurality of mandrels over a semiconductor substrate such that each of the mandrels includes a first sidewall composed of a first material and a second sidewall composed of a second material that is different from the first material. The first sidewall of a first mandrel of the plurality of mandrels is selectively removed. In addition, a pattern composed of remaining sidewalls of the plurality of sidewalls is transferred onto an underlying layer to form a hard mask in the underlying layer. Further, the fins are formed by employing the hard mask and etching semiconducting material in the substrate.

Another embodiment is also directed to a method for fabricating fins for multigate devices. In accordance with the method, a plurality of sidewalls are formed in a plurality of mandrels over a semiconductor substrate by performing an angular ion implantation process such that each of the mandrels includes a first sidewall composed of a first material and a second sidewall composed of a second material that is different from the first material. The first sidewall of a first mandrel of the plurality of mandrels is removed. In addition, a pattern composed of remaining sidewalls of the plurality of sidewalls is transferred onto an underlying layer to form a hard mask in the underlying layer. Further, the fins are formed by employing the hard mask and etching semiconducting material in the substrate.

An alternative embodiment is directed to a method for fabricating fins for multigate devices. In accordance with the method, a plurality of sidewalls are formed on a plurality of mandrels over a semiconductor substrate by performing an angular deposition process such that each of the mandrels is coated with a first sidewall composed of a first material and a second sidewall composed of a second material that is different from the first material. The first sidewall of a first mandrel of the plurality of mandrels is selectively removed. In addition, a pattern composed of remaining sidewalls of the plurality of sidewalls is transferred onto an underlying layer to form a hard mask in the underlying layer. Further, the fins are formed by employing the hard mask and etching semiconducting material in the substrate.

Another embodiment is directed to a mandrel structure for fabricating fins for multigate devices using a sidewall image transfer process. The mandrel structure includes a plurality of mandrels, where each of the mandrels includes a first sidewall composed of a first material and a second sidewall composed of a second material and where the second material is composed such that the second material is selective with respect to the first material in at least one etching process. The mandrel structure further includes an underlying layer formed of a hard mask material beneath the mandrels and a semiconductor substrate beneath the underlying layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
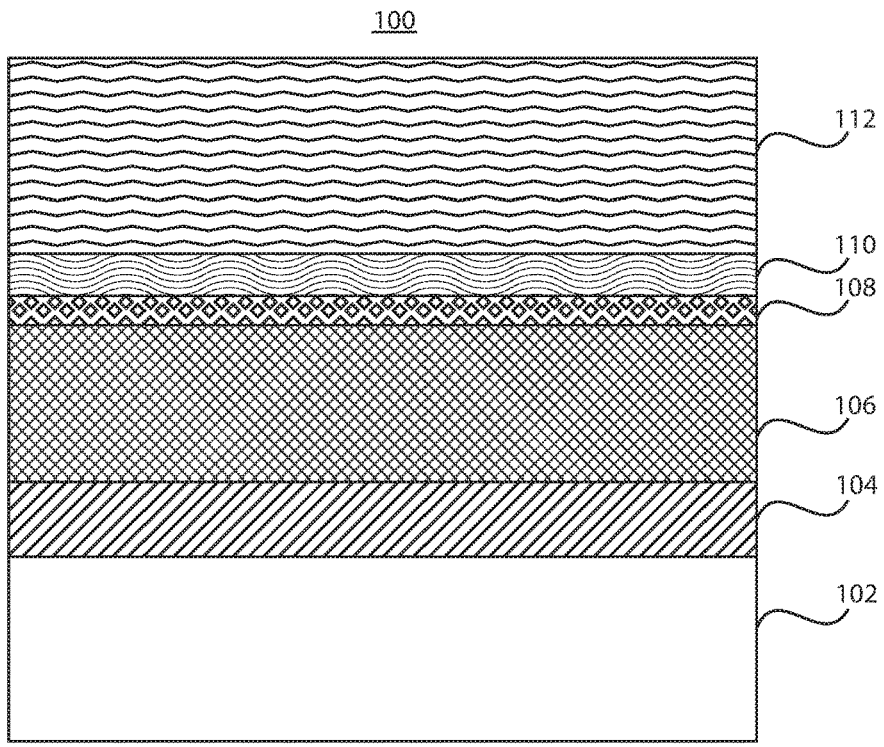
FIG. 1 is a cross-sectional view of a patterning stack in accordance with an exemplary embodiment of the present invention.
Figure 2:
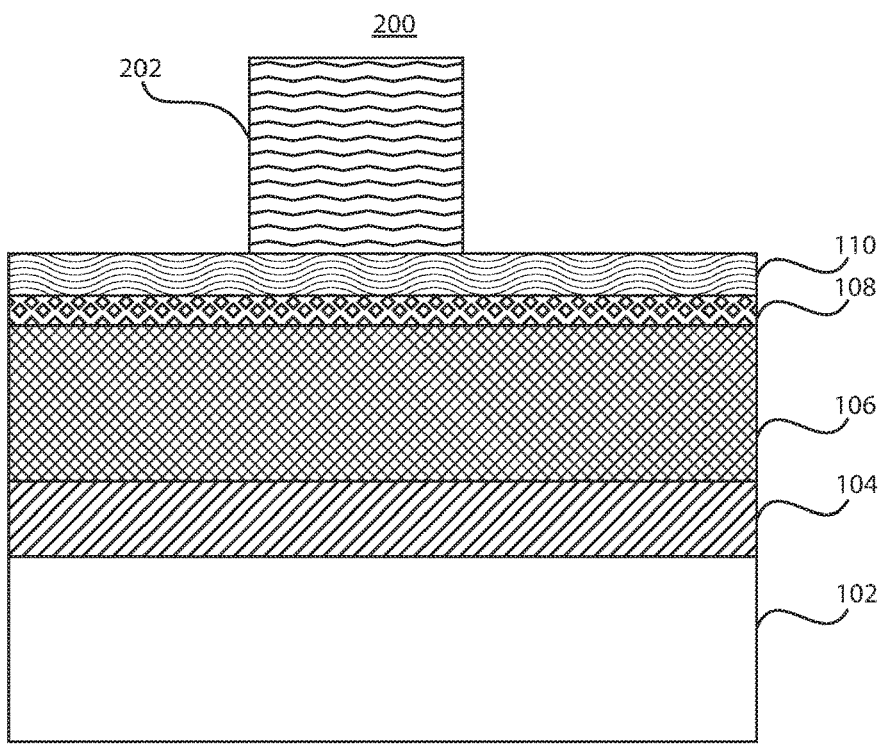
FIG. 2 is a cross-sectional view of a mandrel structure in accordance with an exemplary embodiment of the present invention.
Figure 3:
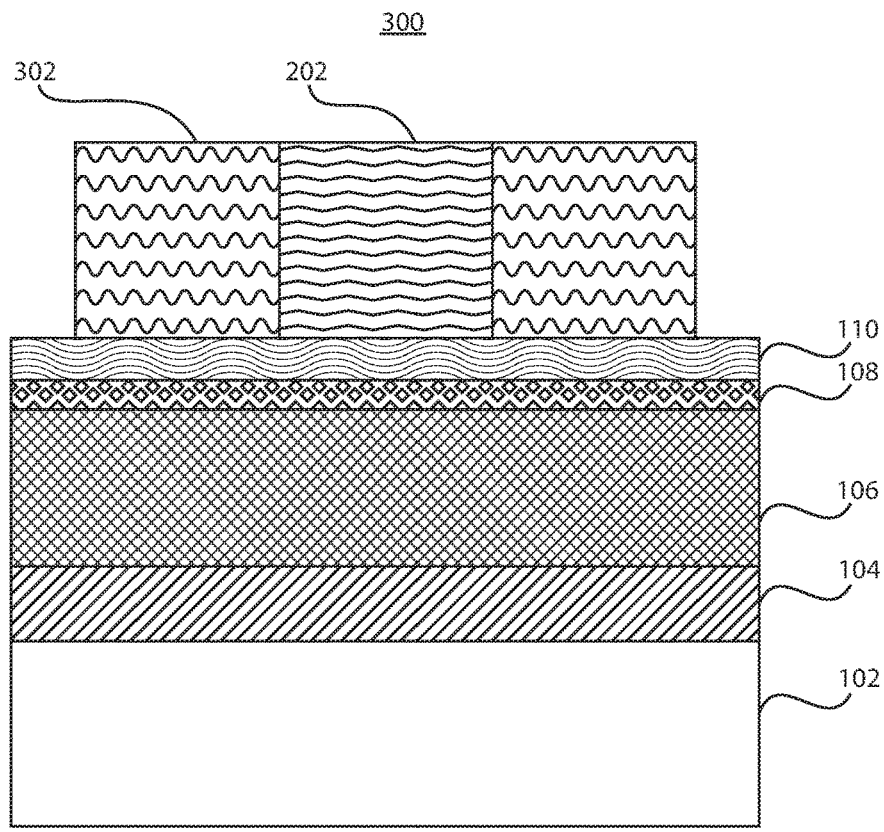
FIG. 3 is a cross-sectional view of a structure illustrating the formation of mandrel spacers in accordance with an exemplary embodiment of the present invention.
Figure 4:
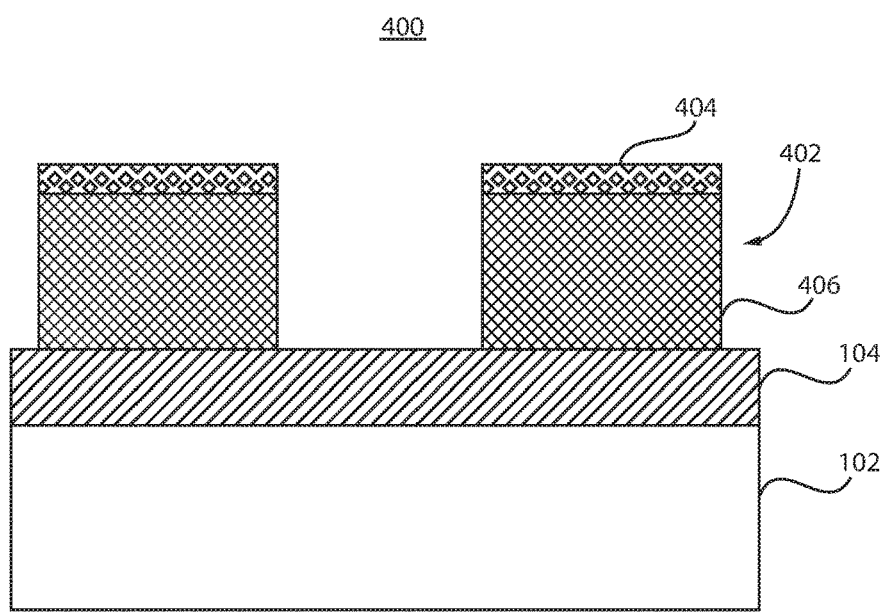
FIG. 4 is a cross-sectional view of a structure illustrating the formation of a mandrel in accordance with an exemplary embodiment of the present invention.

In accordance with preferred embodiments of the present invention, fin density can be controlled using a single fin cut and a single sidewall image transfer (SIT) process. Fin quadrupling can be achieved using a relatively simple patterning stack and relatively simple patterning processes. In particular, in accordance with one advantageous aspect, a lithography mask utilized to pattern the fins for multigate devices can be formed with a significantly relaxed overlay margin. This benefit can be achieved by forming sidewalls of mandrels that are composed of different materials which are selective with respect to each other in plasma dry etch or wet etch processes. The sidewalls can be formed by applying an angular sputtering process deposition and/or an angular ion implantation process. In addition, the materials can be composed such that they can be removed simultaneously using other etching processes after forming a hard mask for the fins. Thus, by leveraging the selectivities of the sidewalls, the SIT pattern can be precisely controlled by using a relatively simple process and a relatively simple patterning stack.

As will be appreciated by one skilled in the art, aspects of the present invention may be embodied as a system, method or device. Aspects of the present invention are described below with reference to flowchart illustrations and/or block diagrams of methods, apparatus (systems) and devices according to embodiments of the invention. It will be understood that each block of the flowchart illustrations and/or block diagrams, and combinations of blocks in the flowchart illustrations and/or block diagrams, illustrate the architecture, functionality, and operation of possible implementations of systems, methods and devices according to various embodiments of the present invention. It should also be noted that, in some alternative implementations, the functions noted in the blocks may occur out of the order noted in the figures.

It is to be understood that the present invention will be described in terms of a given illustrative architecture having a substrate; however, other architectures, structures, substrate materials and process features and steps may be varied within the scope of the present invention.

It will also be understood that when an element described as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. Further, the term "beneath" with respect to an element should be understood to mean below the element in a perpendicular line between the element and the feature described as being beneath an element. Thus, the term "beneath" should not be understood to mean that a feature is only in a different plane with respect to the element. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 16:
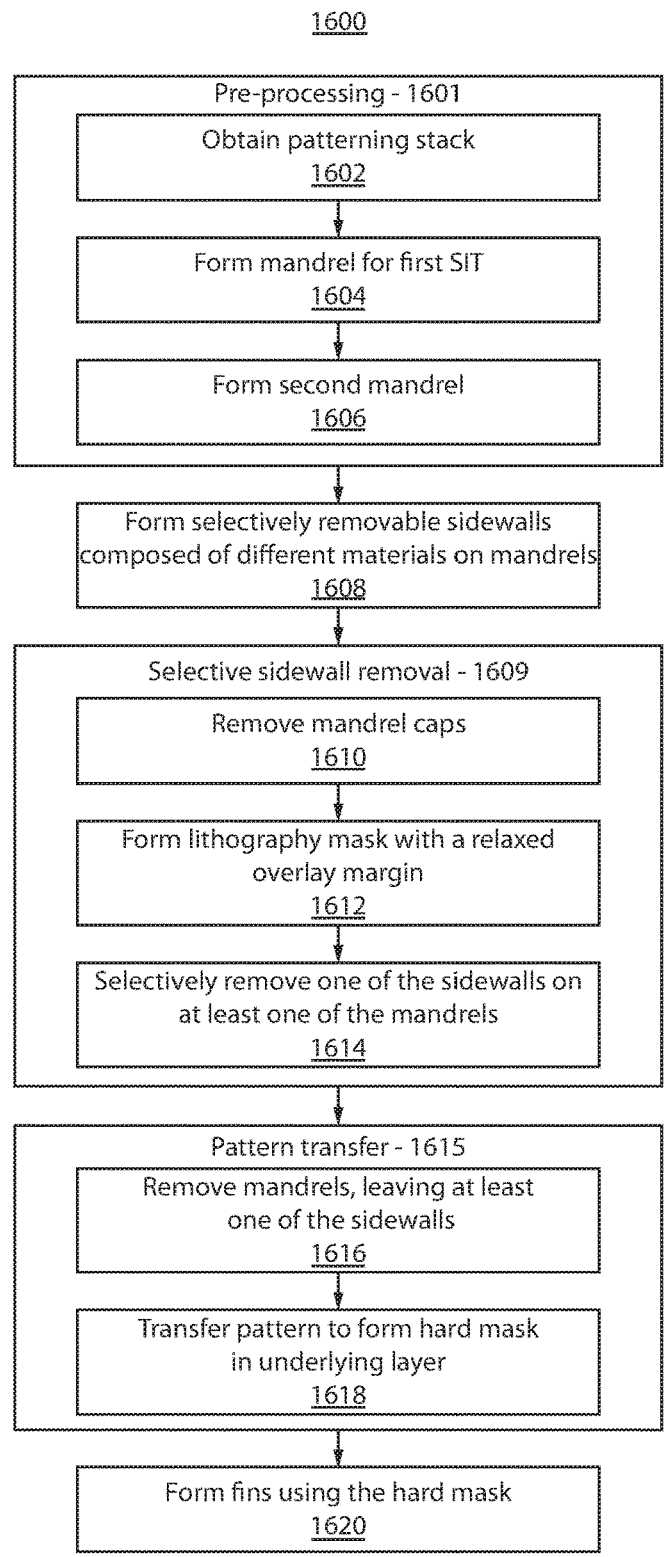
FIG. 16 is a block/flow diagram of a method for forming fins of multigate devices in accordance with an exemplary embodiment of the present invention.

Referring now to the drawings in which like numerals represent the same or similar elements and initially to FIG. 1, a patterning stack 100 in which exemplary embodiments of the present invention can be implemented is illustrated. In particular, FIGS. 1-15 illustrate structures of various processing stages of a method 1600 for forming fins of multi-gate devices in accordance with exemplary embodiments of the present invention. A flow diagram of the method 1600 is provided in FIG. 16.

The method 1600 can begin at step 1601, at which pre-processing can be performed. For example, at step 1602, a patterning stack 100 can be obtained. Here, the patterning stack 100 can be formed by successively depositing several layers onto a semiconductor substrate. In particular, the stack 100 includes, from the bottom to the top of the stack, a semiconductor substrate 102, a dielectric layer 104, a silicon nitride layer 106, a titanium nitride layer 108, an additional silicon nitride layer 110 and an amorphous silicon (A-Si) layer 112. It should be noted that the substrate 102 can be a bulk semiconductor substrate or a semiconductor-on-insulator substrate. Further, the substrate 102 can be composed of silicon, silicon-germanium, germanium or any other suitable semiconductor materials in which fins for multigate devices can be formed. In addition, the dielectric layer 104 is preferably silicon dioxide.

At step 1604, a mandrel 202 can be formed for a first sidewall image transfer process. For example, as illustrated in the structure 200 of FIG. 2, the mandrel 202 can be formed in the A-Si layer 112. In one embodiment, the mandrel 202 is formed through a reactive ion etch (RIE) process. First, a mandrel lithography pattern is formed on top of the layer 112. The lithography patterns can be formed by applying an optical lithography process, such as 193 nm immersion lithography. The stack for the mandrel lithography can be a trilayer stack, or a bilayer stack. Then, an RIE process is used to transfer the lithography mandrel patterns into the layer 112 to form the mandrel structures 202.

At step 1606, a second mandrel can be formed in the stack. For example, as illustrated by structure 300 of FIG. 3, dielectric spacers 302 composed of, for example, SiO$_2$, can be deposited around the mandrel 202. In accordance with one exemplary aspect, the dielectric spacer 302 is deposited through a conformal film deposition process, such as, for example, atomic layer deposition (ALD), molecular layer deposition (MLD), or quasi-ALD or MLD processes. Then, a selective RIE process is employed to remove the spacer on top of mandrel 202 and on the sides of the sidewall spacers 302. In addition, as illustrated by structure 400 of FIG. 4, a sidewall image transfer process can be performed to etch through the layers 110, 108 and 106 to form mandrels 402 composed of a silicon nitride mandrel 406 with a titanium nitride cap 404.

Figure 5:
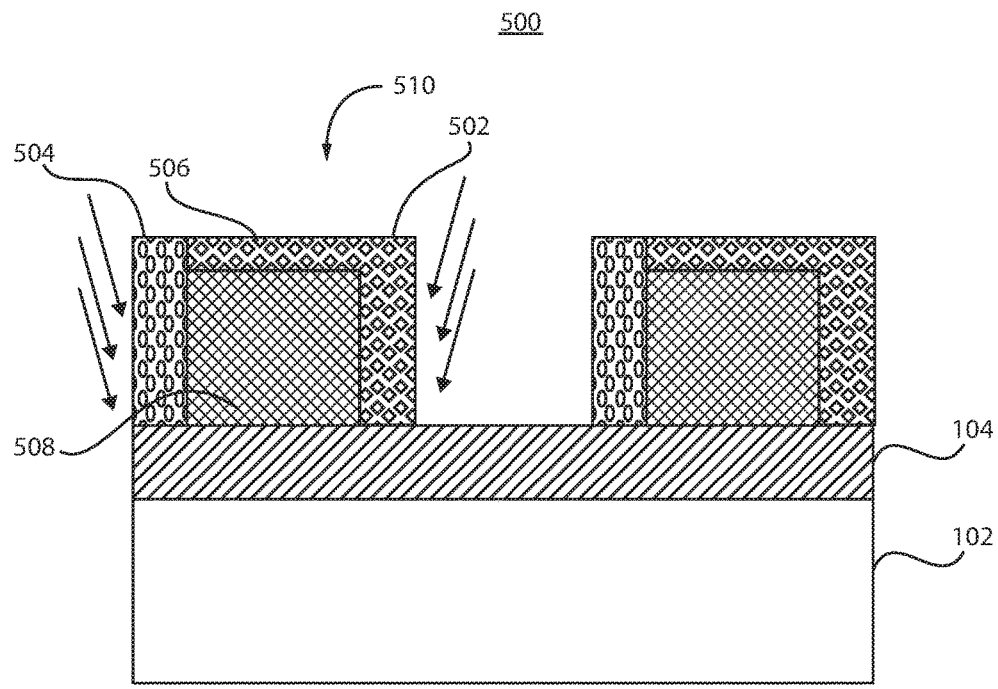
FIG. 5 is a cross-sectional view of a structure illustrating the formation of mandrel sidewalls of different materials having different etching selectivities through an ion implantation process in accordance with an exemplary embodiment of the present invention.
Figure 6:
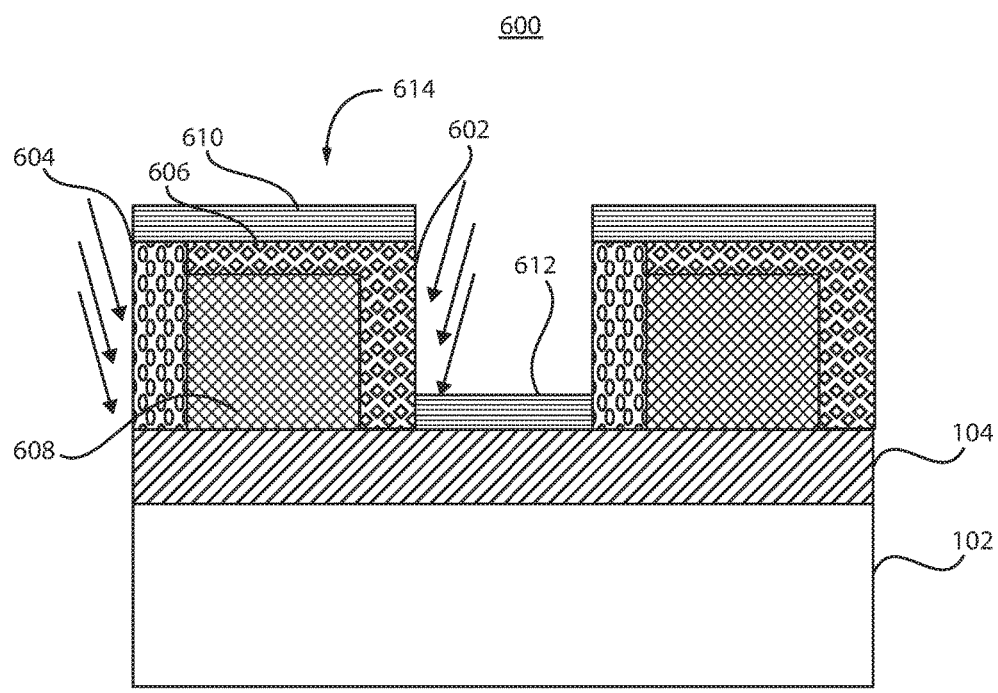
FIG. 6 is a cross-sectional view of a structure illustrating the formation of mandrel sidewalls of different materials having different etching selectivities through an angular deposition process in accordance with an exemplary embodiment of the present invention.

At step 1608, selectively removable sidewalls composed of different materials can be formed in or on the mandrels 402. For example, in accordance with one embodiment, as illustrated by the structure 500 of FIG. 5, angular ion implantation can be performed to form Ti and Ta rich sidewalls on the mandrels 402. For example, angular ion implantation can be employed to implant Ta ions into the mandrels 402 to form TaN sidewalls 504 along the SiN portion 508 of the mandrel 510 and along the TiN cap 506, as illustrated in FIG. 5. Similarly, angular ion implantation can be employed to implant Ti ions into the mandrels 402 to form TiN sidewalls 502 along the SiN portion 508 of the mandrel 510 and along the TiN cap 506, as also illustrated in FIG. 5. The angled implantation can be implemented with ion energy ranges from ~1 keV to 100 keV, and preferably from 1 keV to 10 keV, with the off-normal angle (to the wafer) ranging from 50 degrees to 90 degrees, with specific angles dependent on mandrel height, mandrel pitch, mandrel width, and spacer thickness. Alternatively, the sidewalls can be formed by implementing selective angular sputtering deposition to form TiN and TaN rich sidewalls on the mandrels 402, as illustrated by the structure 600 of FIG. 6. For example, an angular physical vapor deposition (PVD) process can be employed to deposit TaN sidewalls 604 and coat the SiN portion 608 of the mandrel and the TiN cap 606 to form the mandrel 614, as illustrated in FIG. 6. Similarly, an angular PVD process can be employed to deposit TiN sidewalls 602 and coat the SiN portion 608 of the mandrel and the TiN cap 606 to form the mandrel 614, as also illustrated in FIG. 6. TiN/TaN cap layers 610 and 612 formed as a byproduct of the deposition process can be removed, for example, through a reactive ion etch with halogen plasmas.

A benefit of using TiN and TaN sidewalls of the mandrels is that they may be selectively removed with respect to each other. For example, an O$_2$ plasma etch can be employed to selectively remove the TiN sidewall while leaving the TaN sidewall essentially unchanged. As discussed further herein below, this property of the sidewalls can be leveraged to relax the overlay margin of a lithography mask used to remove any undesired sidewalls to form fin masks, which, in turn, can be employed to fabricate fins with a quadrupled fin density using a single fin etch. In addition, the TiN and TaN can also be removed non-selectively in a single step by employing a Cl$_2$/He plasma etching process, as discussed in more detail herein below.

Figure 7:
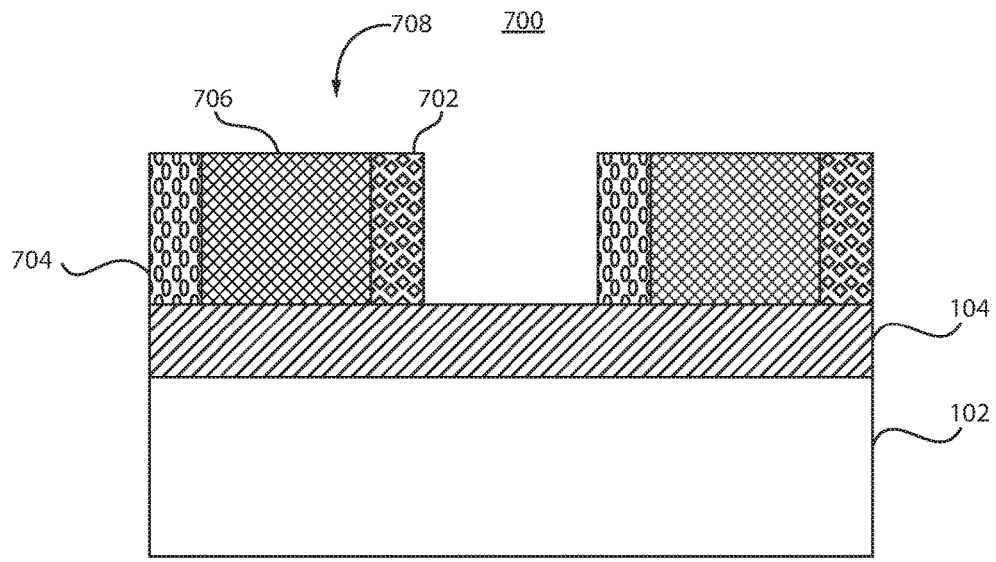
FIG. 7 is a cross-sectional view of a structure illustrating the removal of mandrel caps in accordance with an exemplary embodiment of the present invention.
Figure 8:
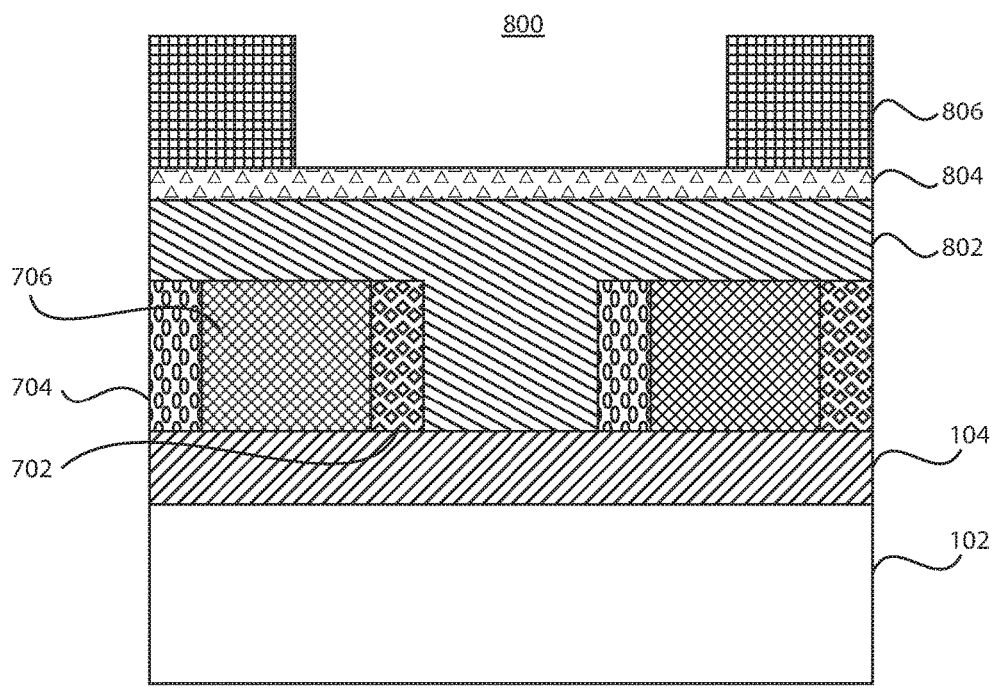
FIG. 8 is a cross-sectional view of a structure illustrating the formation of an optical planarizing layer, a silicon anti-reflective coating and a photoresist for forming a lithography mask with a relaxed overlay margin in accordance with an exemplary embodiment of the present invention.
Figure 9:
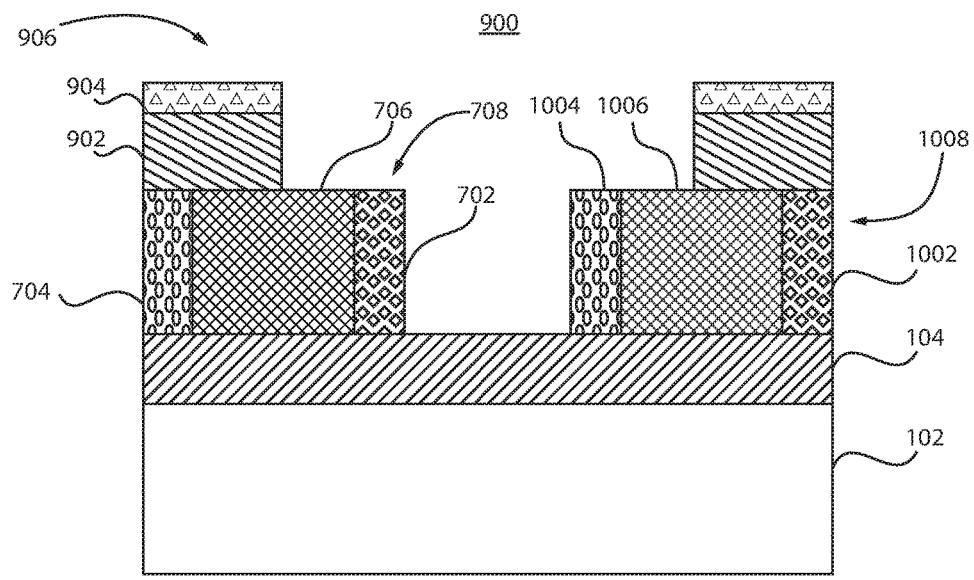
FIG. 9 is a cross-sectional view of a structure illustrating the formation of a lithography mask with a relaxed overlay margin in accordance with an exemplary embodiment of the present invention.
Figure 10:
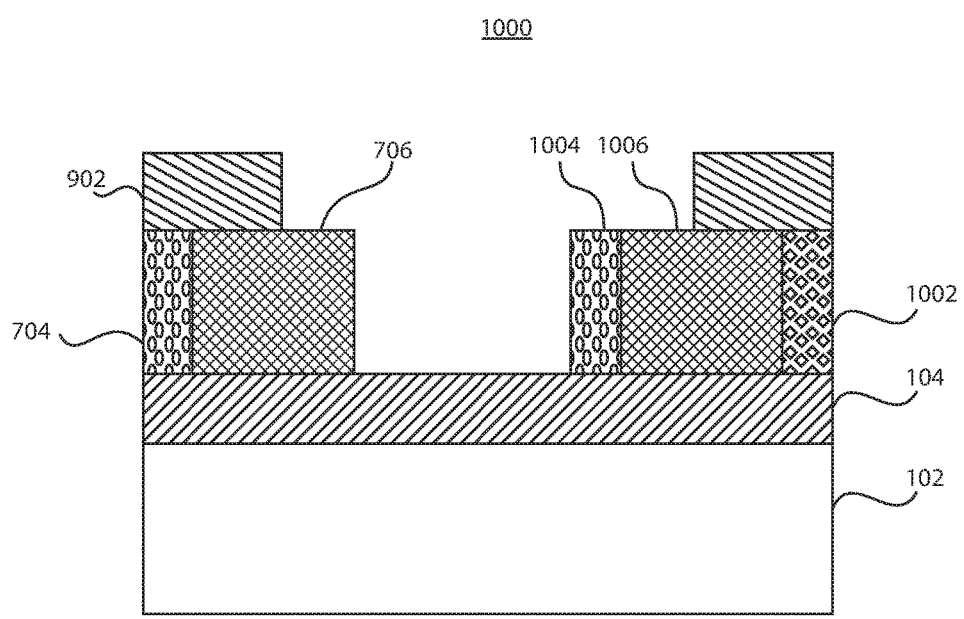
FIG. 10 is a cross-sectional view of a structure illustrating the selective removal of a mandrel sidewall in accordance with an exemplary embodiment of the present invention.

At step 1609, at least one sidewall can be selectively removed from at least one of the mandrels. For example, at step 1610, the mandrel caps can be removed. For example, as illustrated by FIG. 7, the mandrel cap 506 or the mandrel caps 610, 612 and 606 can be removed to form the mandrel structure 700 using, for example a reactive ion etching process, preferably an RIE in halogen plasmas. It should be noted that although only two mandrel structures are formed in the figures, any number of mandrel structures can be formed in accordance with the method 1600.

At step 1612, a cut lithography mask with a relaxed overlay margin can be formed. For example, as illustrated by structure 800 of FIG. 8, an optical planarizing layer (OPL) 802 can be formed over the structure 700 and a silicon anti-reflective coating (SiARC) 804 can be formed over the layer 802. In addition, a photoresist 806 can be formed over the resulting structure in accordance with standard photolithography methods to define the lithography mask for sidewall removal. For example, as illustrated by structure 900 of FIG. 9, the exposed portions of the OPL layer 802 and the SiARC layer 804 can be etched to form the lithography mask 906 composed of the OPL layer 902 and the SiARC layer 904. The SiARC etch can be performed in fluorocarbon-containing plasmas, and the OPL etch can be performed in oxygen-containing plasmas with carbon or HBr containing gases as the passivation to the sidewall features. As noted above, because the mandrel sidewalls can be selectively removed, the overlay margin of the mask 906 is relaxed. For example, the width of the mask 906 (along the horizontal direction of the view illustrated in FIG. 9) need only be sufficient to cover and protect the desired TiN sidewall 1002 of the mandrel 1008, as selective etching of the TiN sidewall 702 of the other mandrel 708 will essentially not affect the TaN sidewall 1004 or the central silicon nitride mandrel portions 706 and 1006. Thus, here, in the structure 900, the lithography mask 906 is formed over the mandrels and sidewalls such that the TiN sidewall 702 of mandrel 708 and the TaN sidewall 1004 of the mandrel 1008 disposed adjacently to the mandrel 708 are exposed. In addition, the mask 906 covers the TiN sidewall 1002 of the mandrel 1008.

At step 1614, one of the sidewalls of at least one of the mandrels can be removed selectively. In one embodiment, a $Cl_2/He/0.3\%\ O_2$ plasma dry etch can be applied to the structure 900 to remove the TiN sidewall 702 of the mandrel 708 selectively against TaN, as illustrated by the structure 1000 of FIG. 10. The etch selectivity of TiN to TaN in this process is over 50 to 1.

Figure 11:
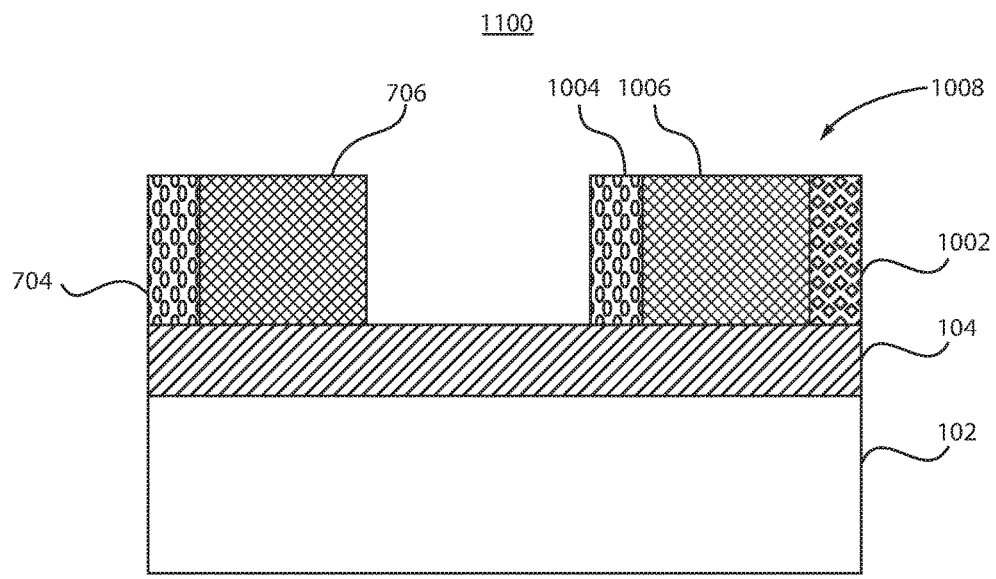
FIG. 11 is a cross-sectional view of a structure illustrating the removal of an optical planarization layer mask in accordance with an exemplary embodiment of the present invention.
Figure 12:
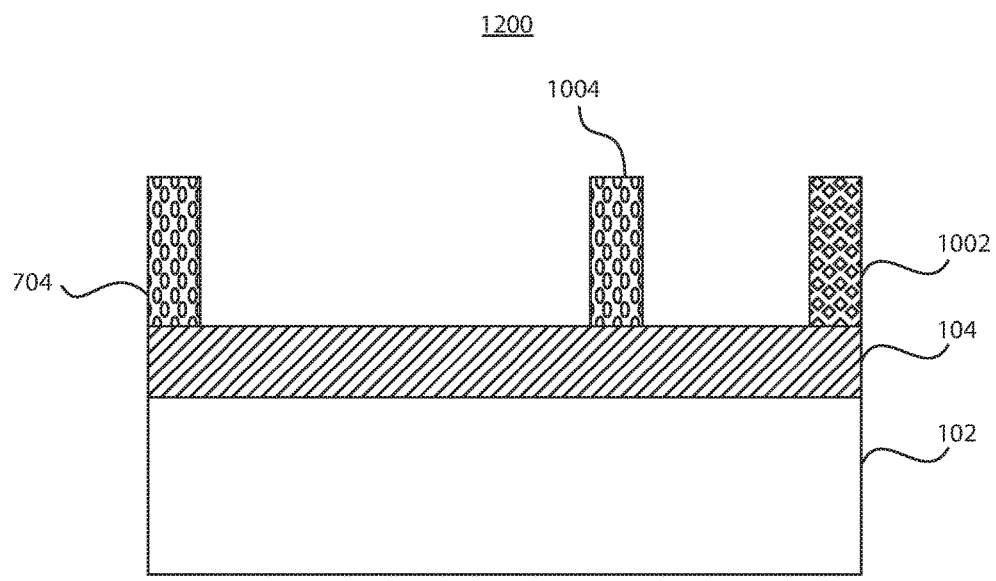
FIG. 12 is a cross-sectional view of a structure illustrating the removal of mandrels in accordance with an exemplary embodiment of the present invention.
Figure 13:
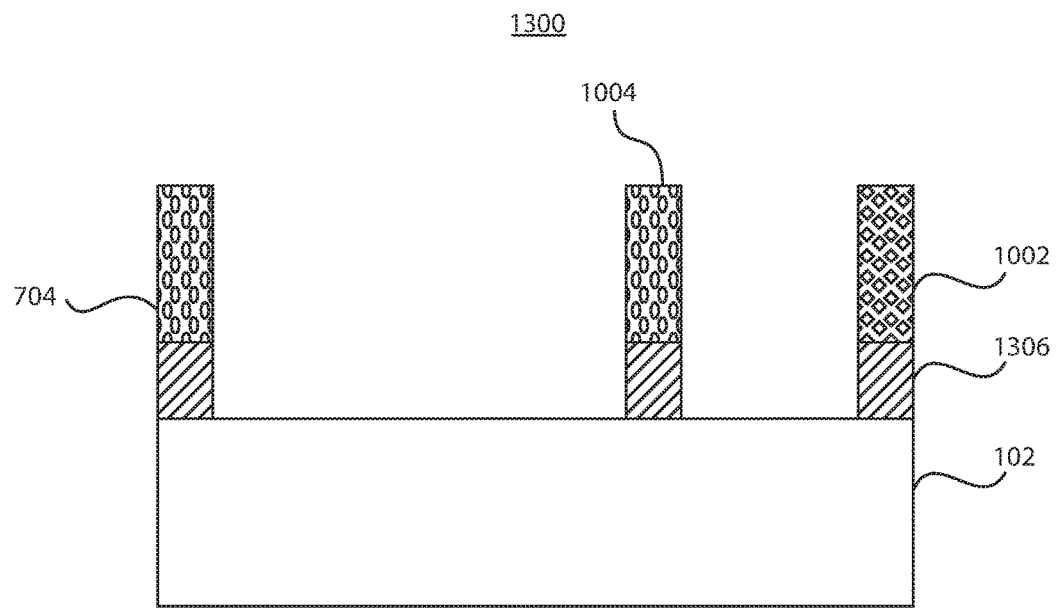
FIG. 13 is a cross-sectional view of a structure illustrating the formation of a hard mask in accordance with an exemplary embodiment of the present invention.
Figure 14:
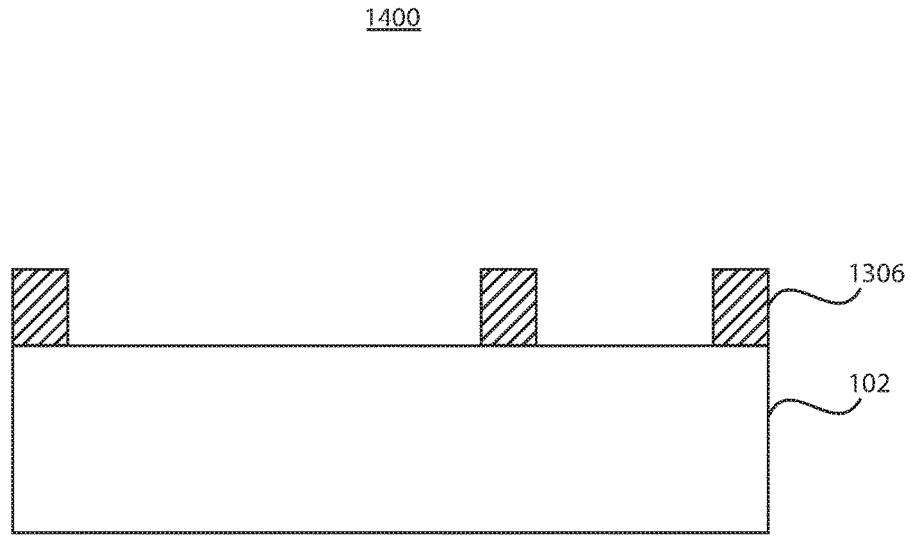
FIG. 14 is a cross-sectional view of a structure illustrating the removal of mandrel sidewalls in accordance with an exemplary embodiment of the present invention.
Figure 15:
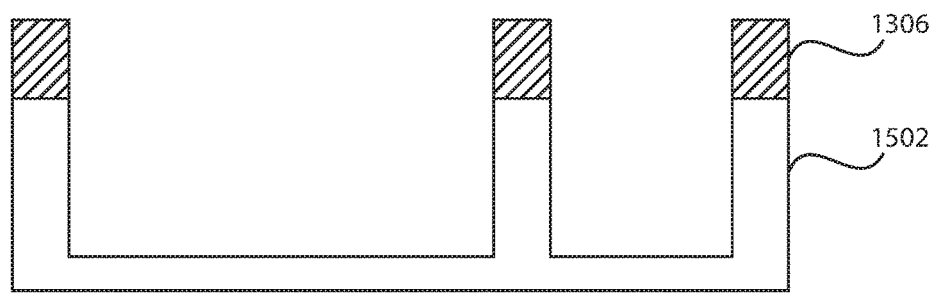
FIG. 15 is a cross-sectional view of a structure illustrating the formation of fins of one or more transistor devices in accordance with an exemplary embodiment of the present invention.

At step 1615, a pattern composed of remaining sidewalls can be transferred onto an underlying layer to form a hard mask in the underlying layer. In this example, the remaining sidewalls forming the pattern include sidewalls 1002, 1004 and 704. For example, to transfer the pattern, the method can proceed to steps 1616-1618. At step 1616, the mandrels can be removed, leaving at least one of the sidewalls. For example, as illustrated by the structure 1100 of FIG. 11, the optical planarization layer mask 902 can be removed through, for example, a reactive ion etch in oxygen-containing plasmas, or through a wet strip in a sulfuric acid/hydrogen peroxide mixture (SPM). As illustrated by FIG. 11, the mandrel 1008, composed of the TiN sidewall 1002, the SiN mandrel portion 1006 and the TaN sidewall 1004, is essentially unchanged since the removal of the mandrel caps at step 1610. As illustrated by structure 1200 of FIG. 12, the SiN mandrels 706 and 1006 can be removed to form the fin fabrication mask composed of sidewalls 704, 1004 and 1002. For example, a hot phosphorous etch can be applied to the structure 1100 to remove the SiN mandrels 706 and 1006.

At step 1618, the pattern of the sidewalls can be transferred to the underlying dielectric layer to form a hard mask for the fins. For example, as illustrated by the structure 1300 of FIG. 13, the dielectric layer 104 can be etched to form the mask 1306 having a pattern consistent with the sidewalls 704, 1004 and 1002. The etch sequence can include dielectric etch steps that employ fluorocarbon gases. In addition, the sidewalls 704, 1004 and 1002 can be removed, as illustrated by the structure 1400 of FIG. 14. In particular, here, the etch selectivity between TaN and TiN is approximately 1 to 1. The TaN sidewall 704, the TaN sidewall 1004 and the TiN sidewall 1002 can be removed simultaneously by applying, for example, a halogen plasma dry etch to the structure 1300. In one embodiment, the halogen plasma can be $Cl_2/He$ or $Cl_2/Ar$ plasmas.

At step 1620, fins can be formed using the hard mask. For example, as illustrated by the structure 1500 of FIG. 15, the fins 1502 can be formed by etching the semiconducting material of the substrate 102 to transfer the pattern of the dielectric hard mask 1306 to the substrate 102. The etch sequence can include silicon etch steps that employ halogen gases in the plasma. As indicated above, the fins 1502 can have a quadrupled fin density and can be formed in a single fin etching step. Thereafter, the multigate devices can be completed using standard methods. For example, gate structures, each including a gate dielectric and a gate electrode, can be formed over the fins, source and drain regions can be formed in the fins through, for example, ion implantation or ALD, appropriate contacts using standard methods can be formed, etc., as understood by those of ordinary skill in the art.

Having described preferred embodiments of methods and devices for fin density control of multigate devices through sidewall image transfer processes (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating multigate devices comprising:
   forming a mandrel on a semiconductor substrate;
   forming a first sidewall composed of a first material directly in contact with the mandrel previously formed on the semiconductor substrate; and
   forming a second sidewall composed of a second material that is different from the first material directly in contact with the mandrel, wherein the second sidewall is opposite the first sidewall on the same mandrel.

2. The method of claim 1, wherein the first sidewall is formed by angular ion implantation, and the second sidewall is formed by angular ion implantation.

3. The method of claim 2, wherein the angular ion implantation is implemented with ion energy ranges from about 1 keV to 100 keV.

4. The method of claim 2, wherein the first sidewall is formed by angular ion implantation of tantalum (Ta), and the second sidewall is formed by angular ion implantation of titanium (Ti).

5. The method of claim 2, wherein the angular ion implantation is conducted with an off-normal angle from the semiconductor substrate from 50 degrees to 90 degrees.

6. The method of claim 2, wherein the first sidewall is formed by a first angular sputtering process deposition, and the second sidewall is formed by a second angular sputtering process deposition.

7. The method of claim 6, wherein the first angular sputtering process deposition forms a tantalum nitride (TaN) first sidewall, and the second angular sputtering process deposition forms a titanium nitride (TiN) second sidewall.

8. The method of claim 7, further comprising selectively removing the tantalum nitride (TaN) first sidewall from the mandrel while leaving the titanium nitride (TiN) second sidewall.

9. The method of claim 8, further comprising selectively removing the mandrel, and transferring the pattern of the titanium nitride (TiN) second sidewall to an underlying layer to form a hardmask.

10. A method for fabricating fins for multigate devices comprising:

forming a first mandrel and a second mandrel on a dielectric layer on a semiconductor substrate;

forming a first sidewall composed of a first material directly in contact with the first mandrel and a second sidewall of the first material directly in contact with the second mandrel;

forming a third sidewall composed of a second material that is different from the first material directly in contact with the first mandrel and a fourth sidewall of the second material directly in contact with the second mandrel; and forming a lithography mask over at least the first sidewall composed of a first material directly in contact with the first mandrel and the fourth sidewall of the second material directly in contact with the second mandrel.

11. The method of claim 10, wherein the first sidewall, the second sidewall, the third sidewall, and the fourth sidewall are formed by angular ion implantation.

12. The method of claim 10, further comprising selectively removing the third sidewall composed of the second material from the first mandrel; and selectively removing the first mandrel and the second mandrel.

13. The method of claim 12, further comprising transferring a pattern formed by the remaining first sidewall, second sidewall, and fourth sidewall onto the underlying dielectric layer to form a hard mask below each of the first sidewall, second sidewall, and fourth sidewall; and forming a fin below each hardmask by etching the semiconductor substrate.

14. The method of claim 10, wherein an angular deposition process forms the first sidewall and the second sidewall, wherein the first sidewall and the second sidewall are tantalum nitride (TaN).

15. The method of claim 14, wherein an angular deposition process forms the third sidewall and the fourth sidewall, wherein the third sidewall and the fourth sidewall are titanium nitride (TiN).

16. The method of claim 15, wherein the third sidewall composed of TiN is selectively removed using an oxygen ($O_2$) plasma etch.

17. A mandrel structure for fabricating fins for multigate devices using a sidewall image transfer process comprising:

a mandrel having a first sidewall composed of a first material covering a first side of the mandrel, and a second sidewall composed of a second material covering a second side of the mandrel opposite the first sidewall, wherein the second material is selectively etchable with respect to the first material;

an underlying dielectric layer below the plurality of mandrels; and an optical planarization layer over the plurality of mandrels.

18. The mandrel structure of claim 17, wherein the second material is tantalum nitride (TaN) and the first material is titanium nitride (TiN).

19. The mandrel structure of claim 18, wherein the mandrels are composed of silicon nitride.

* * * * *